(12) United States Patent
Shrank et al.

(10) Patent No.: US 7,548,105 B2
(45) Date of Patent: Jun. 16, 2009

(54) METHOD AND APPARATUS FOR SOURCE SYNCHRONOUS TESTING

(75) Inventors: Robert W. Shrank, Salinas, CA (US); Moussa Sobaiti, Salinas, CA (US); Prashant Shamarao, Alpharetta, GA (US); Brian Butka, Alpharetta, GA (US); Jim K. Harris, Loganville, GA (US)

(73) Assignee: Integrated Device Technology, inc, San Jose, CA (US)

( * ) Notice: Subject to any disclaimer, the term of this patent is extended or adjusted under 35 U.S.C. 154(b) by 476 days.

(21) Appl. No.: 11/395,079

(22) Filed: Mar. 31, 2006

(65) Prior Publication Data

US 2006/0294411 A1 Dec. 28, 2006

Related U.S. Application Data

(60) Provisional application No. 60/689,317, filed on Jun. 10, 2005, provisional application No. 60/690,749, filed on Jun. 15, 2005.

(51) Int. Cl.
*G06F 19/00* (2006.01)
*H03H 11/26* (2006.01)

(52) U.S. Cl. ............... 327/276; 714/724; 714/731; 327/158

(58) Field of Classification Search ............... 327/156, 327/149, 158, 107, 105, 276, 261; 714/731, 714/718, 724
See application file for complete search history.

(56) References Cited

U.S. PATENT DOCUMENTS

| | | | |
|---|---|---|---|
| 5,986,830 A * | 11/1999 | Hein | 360/45 |
| 6,356,132 B1 * | 3/2002 | Mastrocola et al. | 327/276 |
| 6,505,149 B1 | 1/2003 | Griswold et al. | |
| 6,760,873 B1 | 7/2004 | Hao et al. | |
| 6,775,637 B2 | 8/2004 | Garcia | |
| 7,164,297 B2 * | 1/2007 | Flynn | 327/107 |
| 7,197,682 B2 * | 3/2007 | Niijima | 714/731 |
| 7,240,269 B2 * | 7/2007 | Ochi | 714/744 |
| 2004/0181714 A1 | 9/2004 | Jungerman | |

* cited by examiner

*Primary Examiner*—Dinh T. Le
(74) *Attorney, Agent, or Firm*—Heimlich Law

(57) ABSTRACT

A method and apparatus for source synchronous testing have been disclosed. In one case a data signal is delayed and a selectively activated delay is applied to a clock. This allows the clock to be positioned before the data and also after the data.

4 Claims, 13 Drawing Sheets

METHOD AND APPARATUS FOR SOURCE SYNCHRONOUS TESTING

RELATED APPLICATION

This patent application claims priority of U.S. Provisional Application Ser. No. 60/689,317 filed 10 Jun. 2005 titled "Method and Apparatus for Source Synchronous Testing", which is hereby incorporated herein by reference. This patent application claims priority of U.S. Provisional Application Ser. No. 60/690,749 filed 15 Jun. 2005 titled "Method and Apparatus for Source Synchronous Testing", which is hereby incorporated herein by reference.

FIELD OF THE INVENTION

The present invention pertains to testing. More particularly, the present invention relates to a method and apparatus for source synchronous testing.

BACKGROUND OF THE INVENTION

Logic devices are reaching increasingly faster speeds. As the speed continues to increase testing the devices becomes more difficult. This presents a problem.

Testers that are capable of dealing with source synchronous (sync) testing are expensive. This presents a problem.

Trying to guarantee source sync timing parameters by design (or characterization) is not a good solution because without actual testing one cannot be sure that a product meets the required specifications. Random defects and other anomalies may affect device performance. This may present a problem.

FIG. 3 illustrates a situation 300 with clocks and outputs in perfect alignment. Here a clock (CLK) 302 and data d0, ..., dn (312-0, ..., 312-n respectively) are all clocked by an internal clock (Int Clk) 320 into respective registers 304, 314-0, ..., 314-n, then buffered respectively by 306, 316-0, ..., 316-n, and presented as an output clock 308, and output data 318-0, ..., 318-n all perfectly aligned at t0 322.

FIG. 4 illustrates a sync source datasheet specification (spec), for example, using the 250 MHz QDR (Quad Data Rate) SRAM as an example. One of the specs denoted as tCQHQX specifies that no output transitions will occur greater than 300 pS before the output clock. Likewise tCQHQV also specifies that no output transitions will occur greater than 300 pS after the output clock. FIG. 4 illustrates this situation 400 with clocks and outputs. Here a clock (CLK) 402 and data d0, ..., dn (412-0, ..., 412-n respectively) are all clocked by an internal clock (Int Clk) 420 into respective registers 404, 414-0, ..., 414-n, then buffered respectively by 406, 416-0, ..., 416-n, and presented as clock output 408, and data outputs 418-0, ..., 418-n where for illustration purposes, output clock 408 is centered at t0 422, and output d0 418-0 illustrates an early output at tb 421 with respect to output clock 408 at t0, and output dn 418-n illustrates a late output at ta 423 with respect to output clock 408 at t0. The 250 MHz QDR spec requires these data out transitions to be within 300 ps of the output clock. How to test for this may present a problem.

BRIEF DESCRIPTION OF THE DRAWINGS

The invention is illustrated by way of example and not limitation in the figures of the accompanying drawings in which.

DETAILED DESCRIPTION

Figure 5:
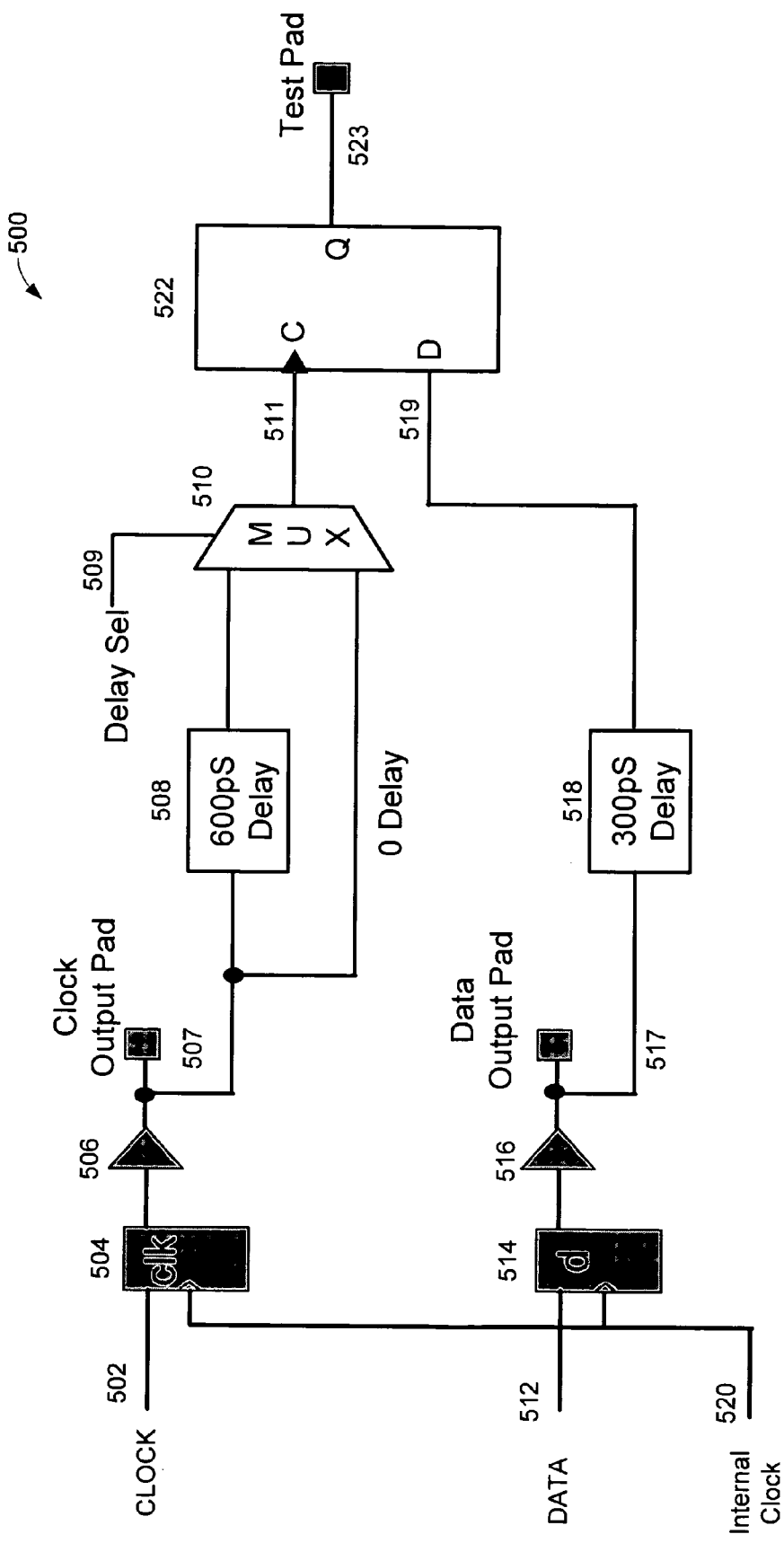
FIG. 5 illustrates one embodiment of the invention showing a single clock and a single data output.

FIG. 5 illustrates one embodiment of the invention 500 showing a single clock and a single data output and a sync source test circuit. A CLOCK 502 and DATA 512 are clocked by an Internal Clock 520 into respective registers 504, and 514, then buffered respectively by 506, and 516, and presented as clock output 507 at Clock Output Pad, and as data output 517 at Data Output Pad. The clock output 507 then is communicated to one input of a multiplexer (MUX) 510, denoted as 0 Delay. Clock output 507 is also communicated to the input of a delay 508 denoted as 600 pS Delay. The output of delay 508 is communicated to a second input of mux 510. 509 is a delay selection (Delay Sel) signal controlling mux 510 to select either the 0 Delay signal or the 600 ps delayed signal (from 508). The output 511 of the mux 510 goes to the clock input (C) of circuit 522. Data output 517 is communicated to the input of a delay 518 denoted as 300 pS Delay. The output of delay 518 is communicated to the data input (D) 519 of circuit 522. The output (Q) 523 of circuit 522 goes to a pad denoted as Test Pad.

The circuit as described in FIG. 5 allows the positioning of the rising edge of the clock output 507 300 ps before the data output 517 transition if the 0 Delay is selected at mux 510, or positioning the clock output 507 300 ps after the data output 517 transition If the 600 ps clock delay is selected at mux 510. The test pad may be monitored using a tester channel, or the circuit output could be stored in a serial register that could be interrogated using, for example, a BIST (Built-In Self-Test) approach, such as, JTAG (Joint Test Action Group).

In one embodiment of the invention, as illustrated in FIG. 5 all signals and connections (i.e. 502 through 523) are envisioned to be inside an IC (Integrated Circuit). Clock Output Pad, Data Output Pad, and Test Pad may represent, for example, pads located on the surface of the IC. In one embodiment of the invention one or more of these pads may be used to make connections outside of the IC package (for example, to other circuits). While FIG. 5 illustrates a single clock and data line, the invention is not so limited, and multiple clocks and/or data outputs may be used with embodiments of the invention.

Figure 6:
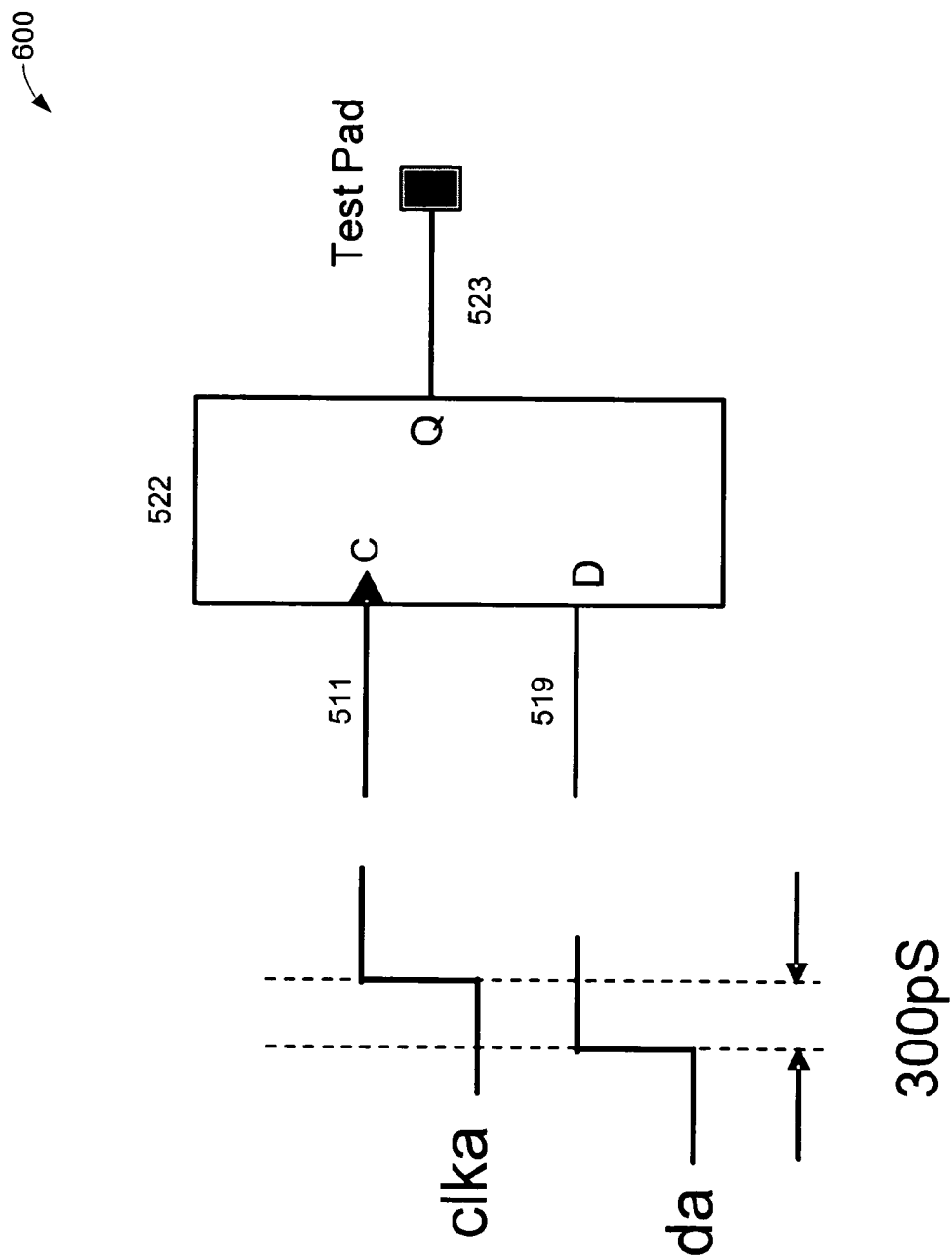
FIG. 6 illustrates one embodiment of the invention showing details of FIG. 5 for the situation where the 600 pS Delay is selected.

FIG. 6 illustrates one embodiment of the invention 600, showing details of FIG. 5 for the situation where the 600 pS Delay 508 is selected at mux 510. At clka the clock selected from the mux 510 goes to the clock input (C) 511 of circuit 522. At da the data output from the delay 518 goes to the data input (D) 519 of circuit 522. The output 523 of circuit 522 goes to a pad denoted as Test Pad. In this example, as shown, we expect to register a "1" (positive logic high) at the test pad because the data input 519 arrives before the clock input 511 and a "1" is clocked into circuit 522 and is output at 523. However, if a "0" is shifted in, then the data da is too late, violating the tCQHQV spec and a "0" will be presented to the test pad.

In the case of a monitored test pin, any pattern could be used. Note that as shown in FIG. 6, the data at 523 is delayed one cycle from the original 517 data output.

Figure 7:
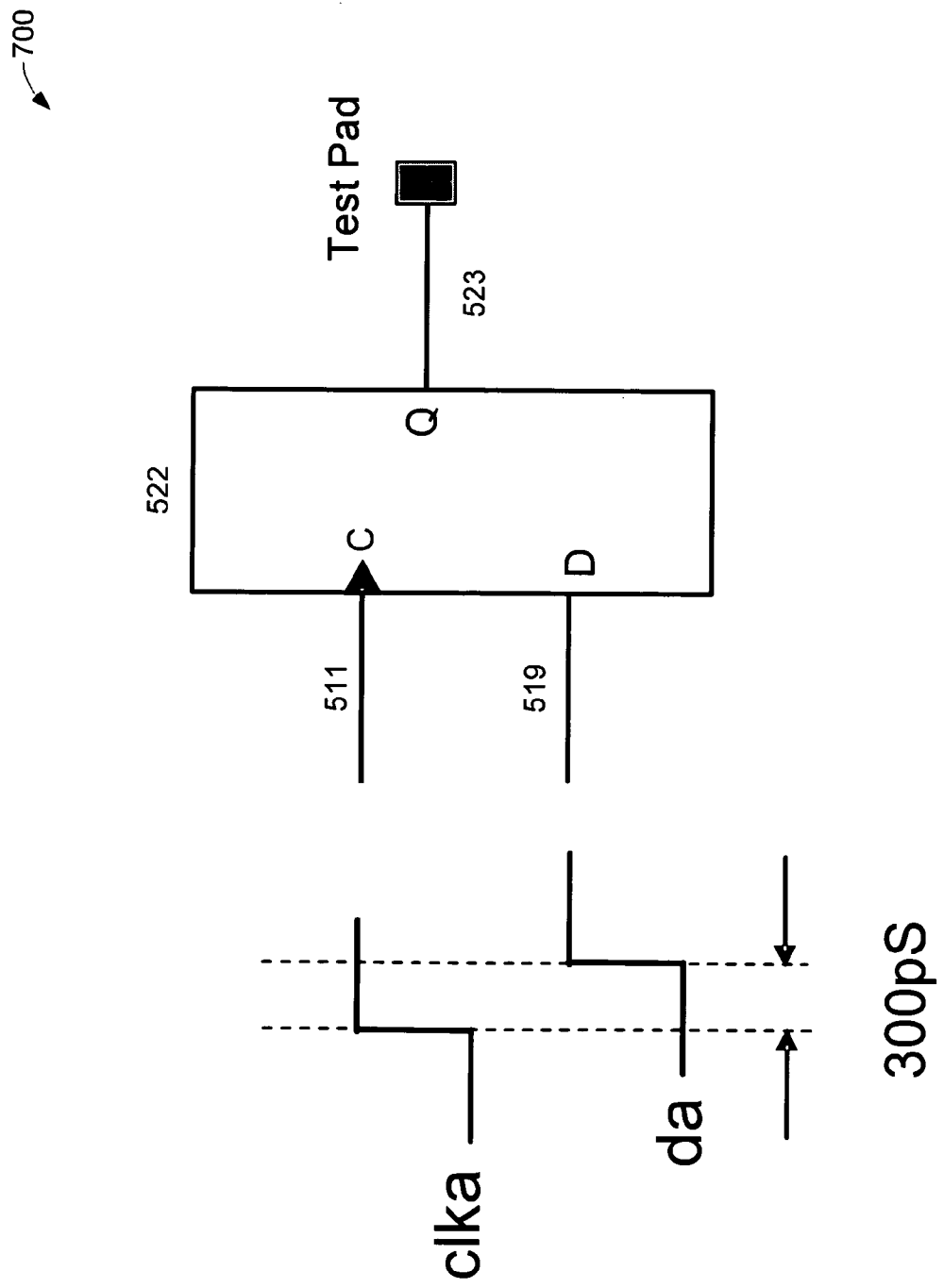
FIG. 7 illustrates one embodiment of the invention showing details of FIG. 5 for the situation where the 0 pS Delay is selected.

FIG. 7 illustrates one embodiment of the invention 700, showing details of FIG. 5 for the situation where the 0 pS Delay (signal 507) is selected at mux 510. At clka the clock selected from the mux 510 goes to the clock input (C) 511 of circuit 522. At da the data output from the delay 518 goes to the data input (D) 519 of circuit 522. The output 523 of circuit 522 goes to a pad denoted as Test Pad. In this example, as shown, we expect to register a "0" (positive logic high) at the test pad because the data input 519 arrives after the clock input 511 and a "0" is clocked into circuit 522 and is output at 523. However, if a "1" is shifted in, then the data da is too early, violating the tCQHQV spec and a "1" will be presented to the test pad.

In the case of a monitored test pin, any pattern may be used. Note that as shown in FIG. 7, the data at 523 is delayed by one cycle from the original 517 data output.

One of skill in the art will appreciate that the present invention as illustrated by embodiments shown in FIG. 5, FIG. 6, and FIG. 7 allows for testing in real time. The "testing" may be done on-chip and the "result" is presented on a test pad for reading by a tester. In one embodiment of the invention, the results presented to a test pad may be latched into an on-chip register and serially read out, using for example, a JTAG approach, or the results may be multiplexed out over existing pins on a device.

In one embodiment of the invention one or more of the delays as illustrated by 508 and 518 in FIG. 5 may be adjustable under program control. In this way a device may be tested over a range of delays. FIG. 5 delays of 300 ps and 600 ps were for illustration only. The invention is not so limited, and any delays may be used. Additionally, FIG. 5 showed only a single clock and a single data, again the invention is not so limited and any number of clocks and/or data outputs may be tested. For example, for complimentary output clocks, parts of the circuit as illustrated in FIG. 5 may need to be duplicated. Additionally, separate data out may be associated with the rising and/or falling edges of a clock or the compliment of a clock.

Embodiments of the present invention may be used with any test pattern. Additionally the technique helps in testing non-deterministic source synchronous outputs.

Thus a method and apparatus for source synchronous testing have been described.

Figure 8:
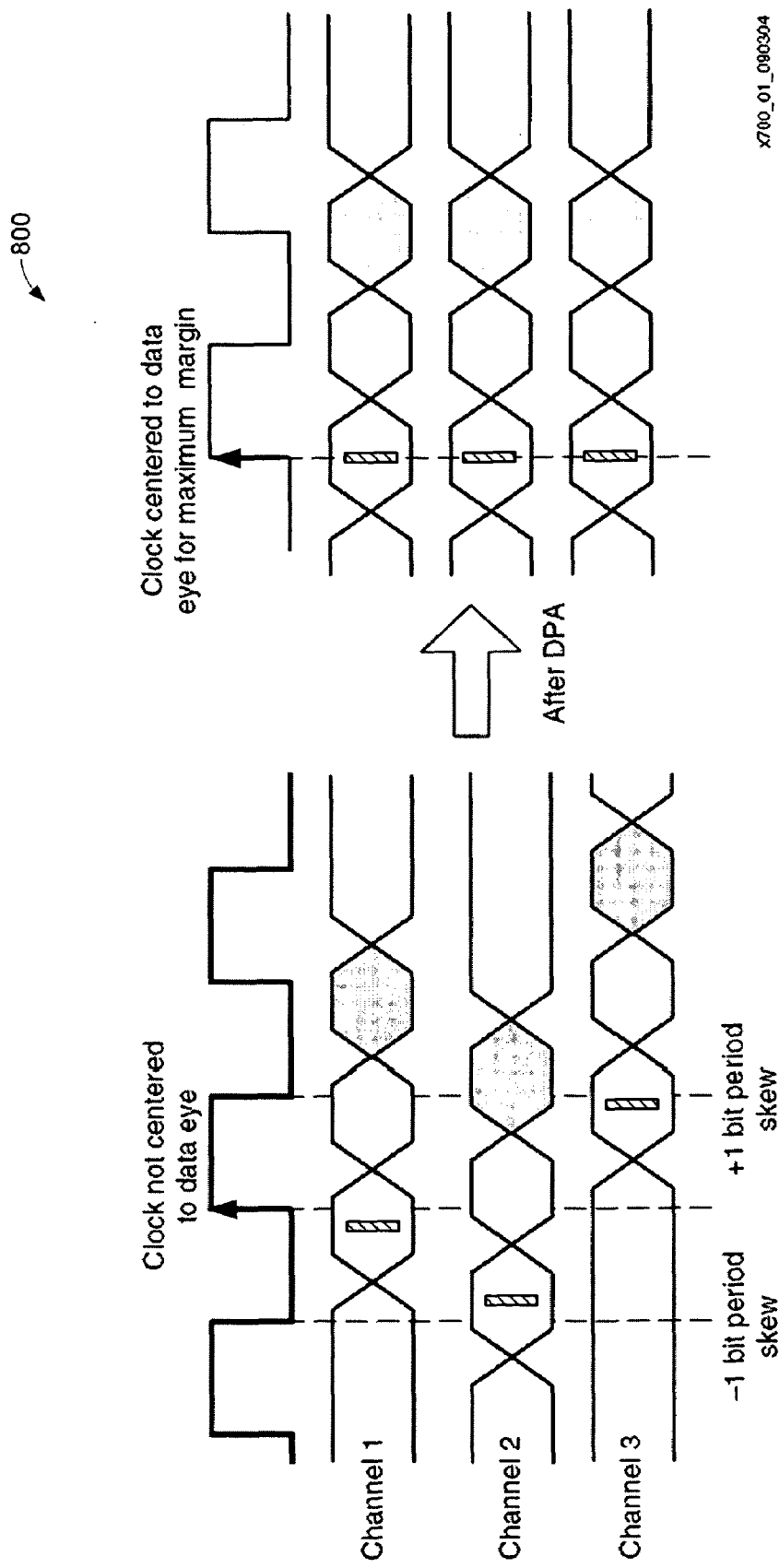
FIG. 8 illustrates an unaligned data eye and an aligned data eye.

FIG. 8 illustrates 800 on the left where Channel 1, 2, and 3 data outputs are not centered (with the rising arrow) to the data eye (represented by hashed rectangles) and range from almost −1 bit period of skew (Channel2) to almost +1 bit period of skew (Channel 3). Using alignment techniques, such as digital phase alignment (DPA), is it possible to "move" (such as delay) the data outputs with respect to the clock. The goal is to align the data eye with the clock as illustrated on the right. However, knowing how much to adjust the data outputs requires testing which another embodiment of the present invention teaches.

In one embodiment of the invention the approach uses signals that are available from outside the IC chip, so it may be thought of as BOST, denoting Built Outside Self Test.

Figure 9:
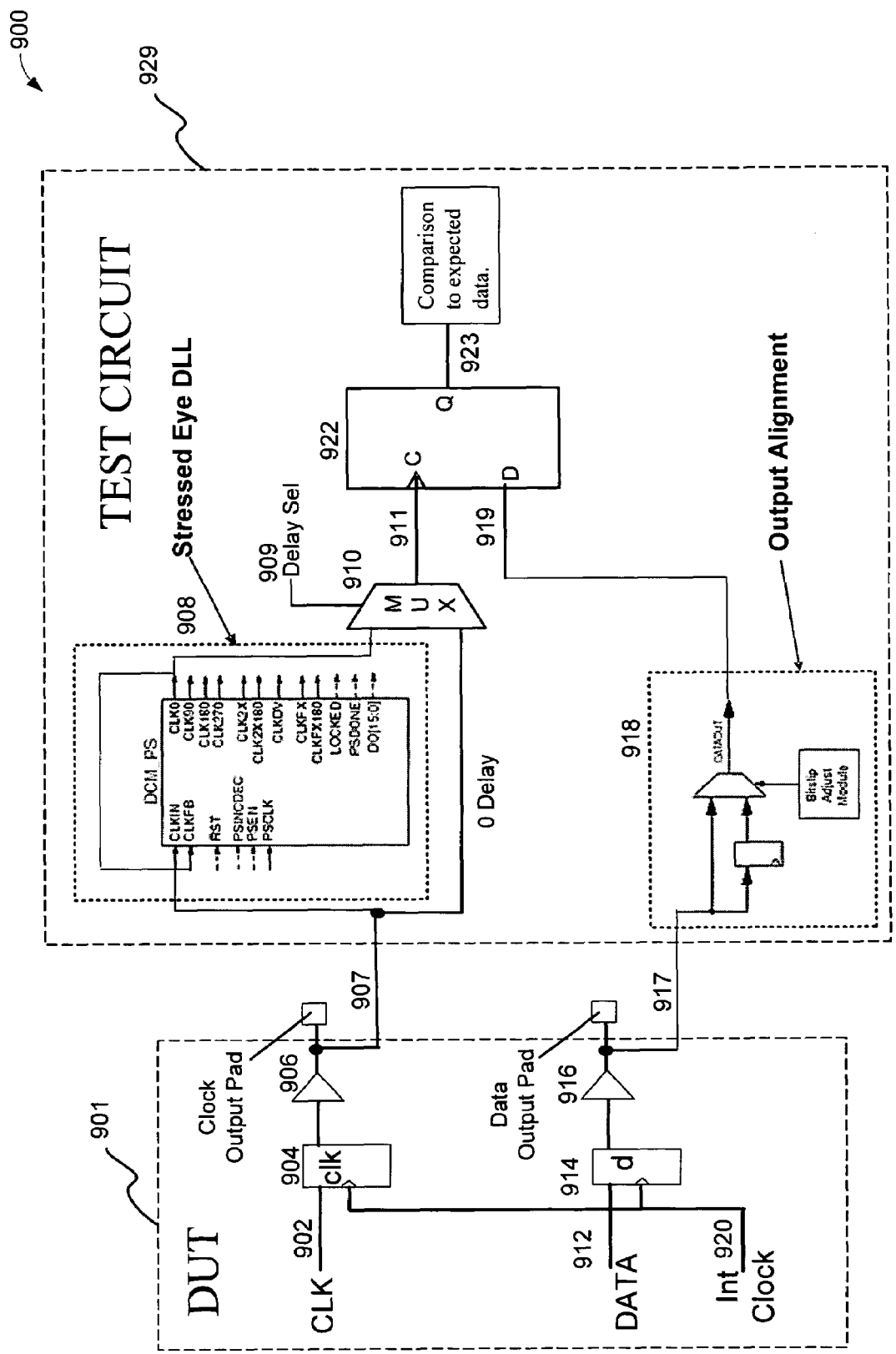
FIG. 9 illustrates one embodiment of the invention showing a single clock and a single data output of a device under test being tested externally.

FIG. 9 illustrates one embodiment 900 of the invention. Block 901 represents a DUT (Device Under Test). The DUT may have a clock CLK 902 and DATA 912 that are clocked by an internal clock (Int Clock) 920 into respective registers 904, and 914, then buffered respectively by 906, and 916, and then presented as clock output 907 at Clock Output Pad, and as data output 917 at Data Output Pad.

Test Circuit 929 has within it a Stressed Eye DLL (Delay Locked Loop) 908 for producing a range of delays (i.e. variable delay unit), and an Output Alignment 918 block, which allows for bit slipping the data output 917. Clock output 907 is communicated to one input of mux 910 and to an input of the Stressed Eye DLL 908. The output of the Stressed Eye DLL 908 goes to another input of the mux 910. Delay Sel 909 controls whether the output of the mux 910 is the 0 Delay clock output signal 907 or a delayed version of the clock output signal 907. The output 911 of mux 910 goes to the clock input (C) of the circuit 922. Data output signal 917 is communicated to the Output Alignment 918 and the output 919 is communicated to the data input (D) of circuit 922. The Output Alignment 918 as shown may directly output the data output 917 or it may delay it by an amount determined by a clocking circuit within the Output Alignment 918 block. Circuit 922 output (Q) 923 is shown going to a block for comparison with expected data.

The embodiment of the present invention as illustrated in FIG. 9 may be used for testing the DUT with any test pattern and under any conditions (such as voltage, temperature, etc.) in real time. By "moving" (via the delay in 908) the timing of the clock (originating from 907 and eventually arriving at 911) relative to the data (917 and eventually arriving at 919) it is possible to observe when correct data is received. Based on this information it is possible to adjust the DUT for near optimum performance, such as centering the data output with a clock output (centering the data eye).

FIG. 9 for illustration purposes only shows a single clock and a single data output. The invention is not so limited and a plurality of clocks and data may be used with embodiments of the invention.

Figure 10:
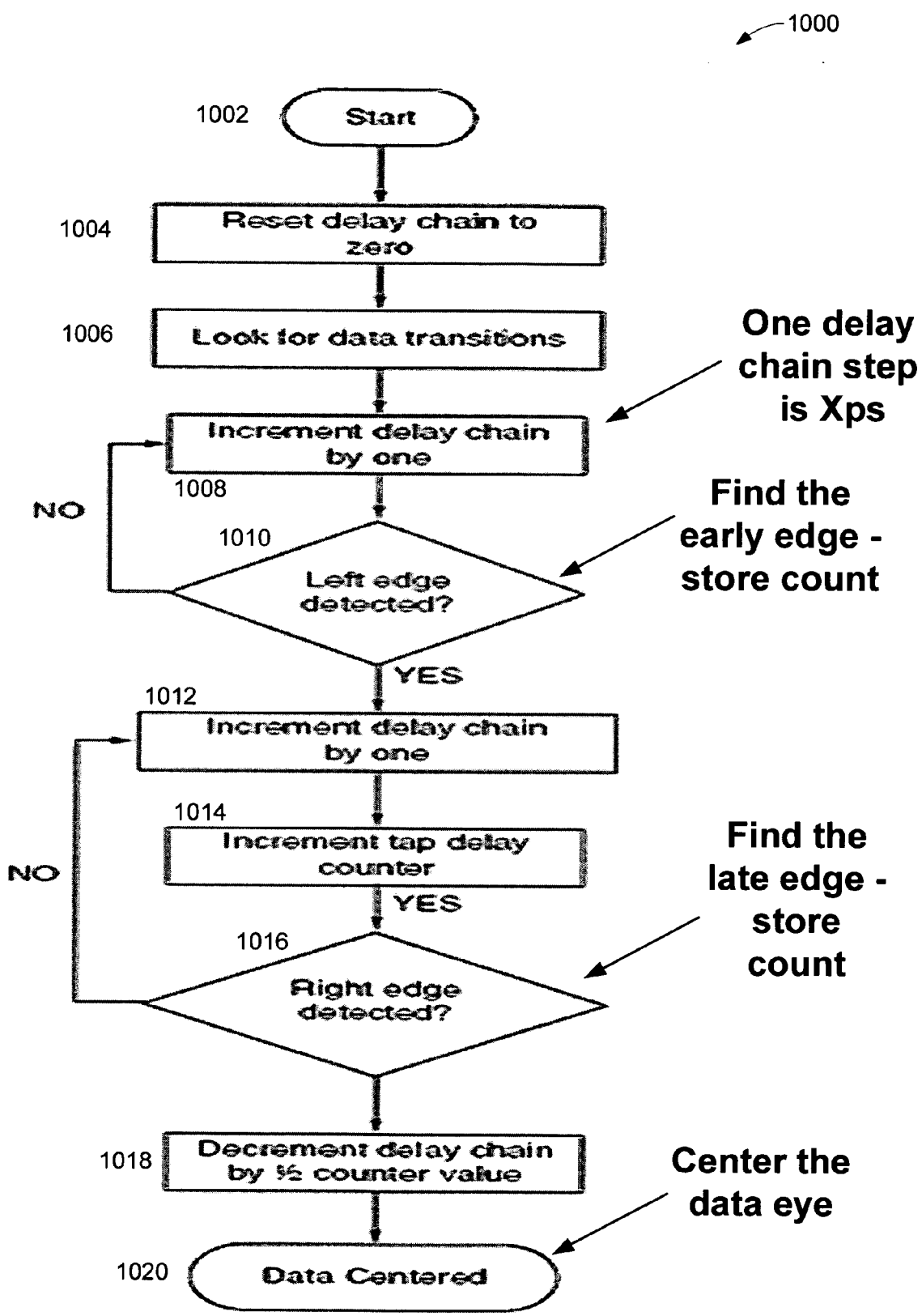
FIG. 10 illustrates in flow chart form one embodiment of the invention for centering the data eye.

FIG. 10 illustrates in flow chart form one embodiment of the invention 1000 for centering the data eye. For illustration purposes, the alignment will be one using a digital phase alignment where each delay chain step has a value of Xps.

At 1002 the centering process is started. At 1004 the delay chain is reset to zero. At 1006 data transitions are looked for. There should be none as the delay chain has been reset to zero. If there are transitions, then, while not explicitly shown in FIG. 10, the process would terminate with a possible error warning. At 1008 the delay is incremented by one. At 1010 we look for transitions and if none are found then loop back to 1008. If transitions are detected then the left edge has been detected 1010. At 1012 the delay chain is incremented by one, the tap delay is incremented and a check 1016 is made to see if the right edge has been detected (i.e. no transitions). If not then loop back to 1012. If the right edge has been detected then at 1018 decrement the delay chain by ½ the counter value and this results in the data being centered 1020.

One of skill in the art will appreciate that there are a variety of ways to "sweep" the clock and data with respect to each other to determine where the center of the data eye is and adjust the data output and/or clock accordingly.

The technique illustrated in FIG. 10 may be performed on known training patterns and will align the data eye across the entire data bus. The timing of all of the data bits relative to the clock is now known for the training pattern.

Additionally the technique as illustrated in FIG. 10 may be used for worst-case pattern timing. By using the stressed eye techniques it is possible to verify the data eye characteristics. Then, by using the technique all data streams (i.e. multiple data outputs) may be aligned, then move the clock early or late and run the worst-case patterns. If the received data is correct then one can guarantee a minimum eye opening. Additionally, as the clock is moved a map of the failing lanes (data outputs) can be made. This allows one to characterize the data eye for every data bit in a bus.

One of skill in the art will appreciate that additional accuracy may be achieved by using the DUT's capabilities as well as the Test Circuit's capabilities. For example using the DUT's DLL in conjunction with the Test Circuit DLL may yield increased accuracy.

Figure 11:
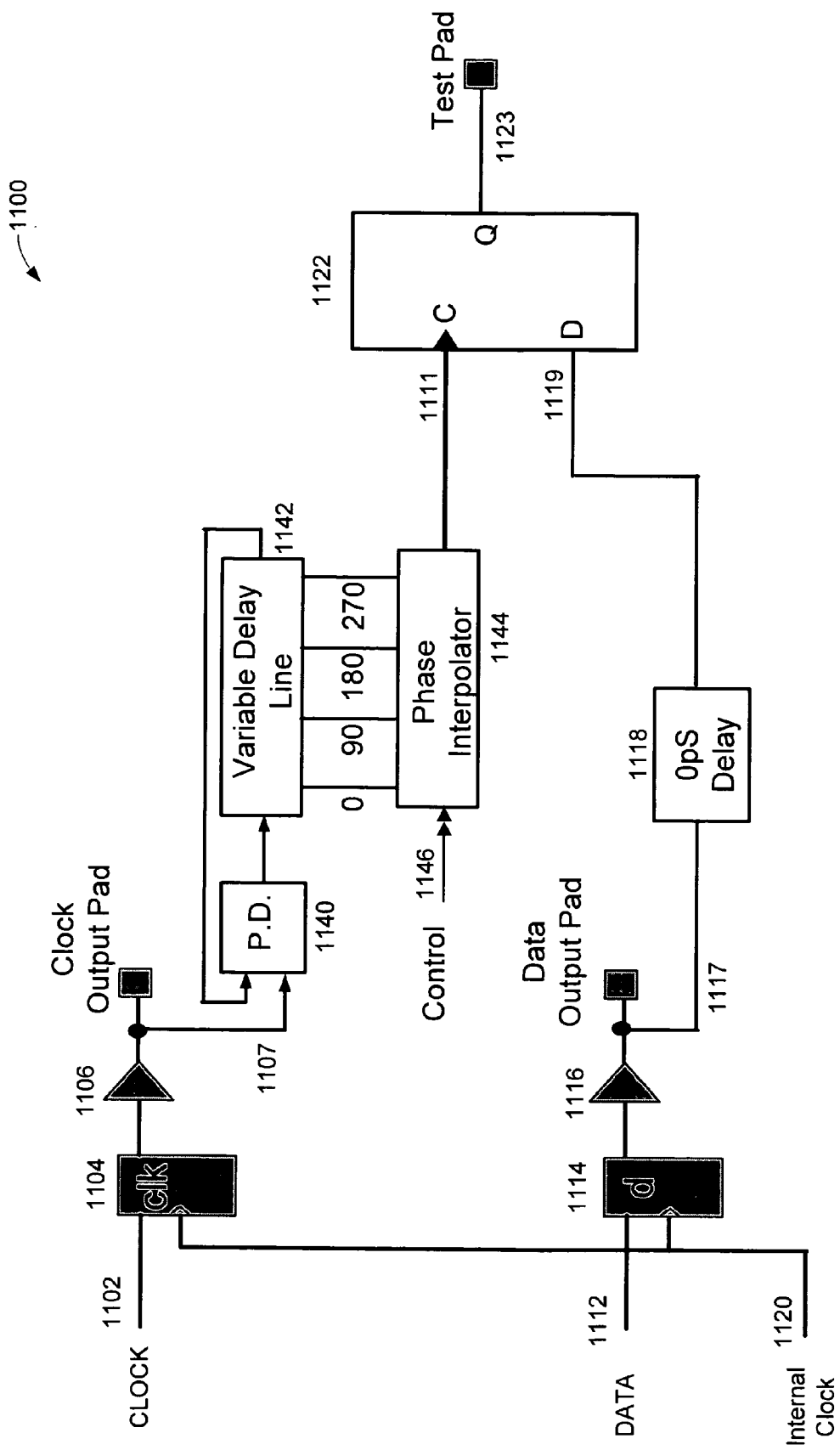
FIG. 11 and FIG. 12 illustrate embodiments for generating accurate delays.

FIG. 11 illustrates one embodiment 1100 of the present invention showing accurate delay generation using a DLL and a phase interpolator (P.I.) for a single clock and a single data output and a sync source test circuit. A CLOCK 1102 and DATA 1112 are clocked by an Internal Clock 1120 into respective registers 1104, and 1114, then buffered respectively by 1106, and 1116, and presented as clock output 1107 at Clock Output Pad, and as data output 1117 at Data Output Pad. The clock output 1107 then is communicated to one input of a phase detector (P.D.) 1140. The output of the P.D. 1140 goes to a Variable Delay Line 1142 whose full delay is looped back to the second input of the P.D. 1140. The P.D. 1140 and the Variable Delay Line 1142 constitute a DLL. The Variable Delay Line 1142 locks to one cycle (or a half cycle) of the clock output 1107 and provides four orthogonal phases (denoted 0, 90, 180, and 270) of the clock output 1107. The four orthogonal phases (0, 90, 180, and 270) from the Variable Delay Line 1142 go to a Phase Interpolator 1144 that is controlled by Control 1146. The Phase Interpolator 1144 can be used to create an arbitrary phase of a clock 1111 with respect to the clock output 1107. One of skill in the art will appreciate that given enough bits in the control word 1146 (and accuracy in the P.I. 1144) a fixed amount of delay can be generated at any given frequency by choosing the appropriate phase (0, 90, 180, or 270) of clock needed. The output 1111 of the Phase Interpolator 1144 goes to the clock input (C) of circuit 1122. Data output 1117 is communicated to the input of a delay 1118 which in this embodiment is 0 ps (i.e. no delay) denoted as 0 pS Delay. The output 1119 of delay 1118 is communicated to the data input (D) of circuit 1122. The output (Q) 1123 of circuit 1122 goes to a pad denoted as Test Pad.

Figure 12:
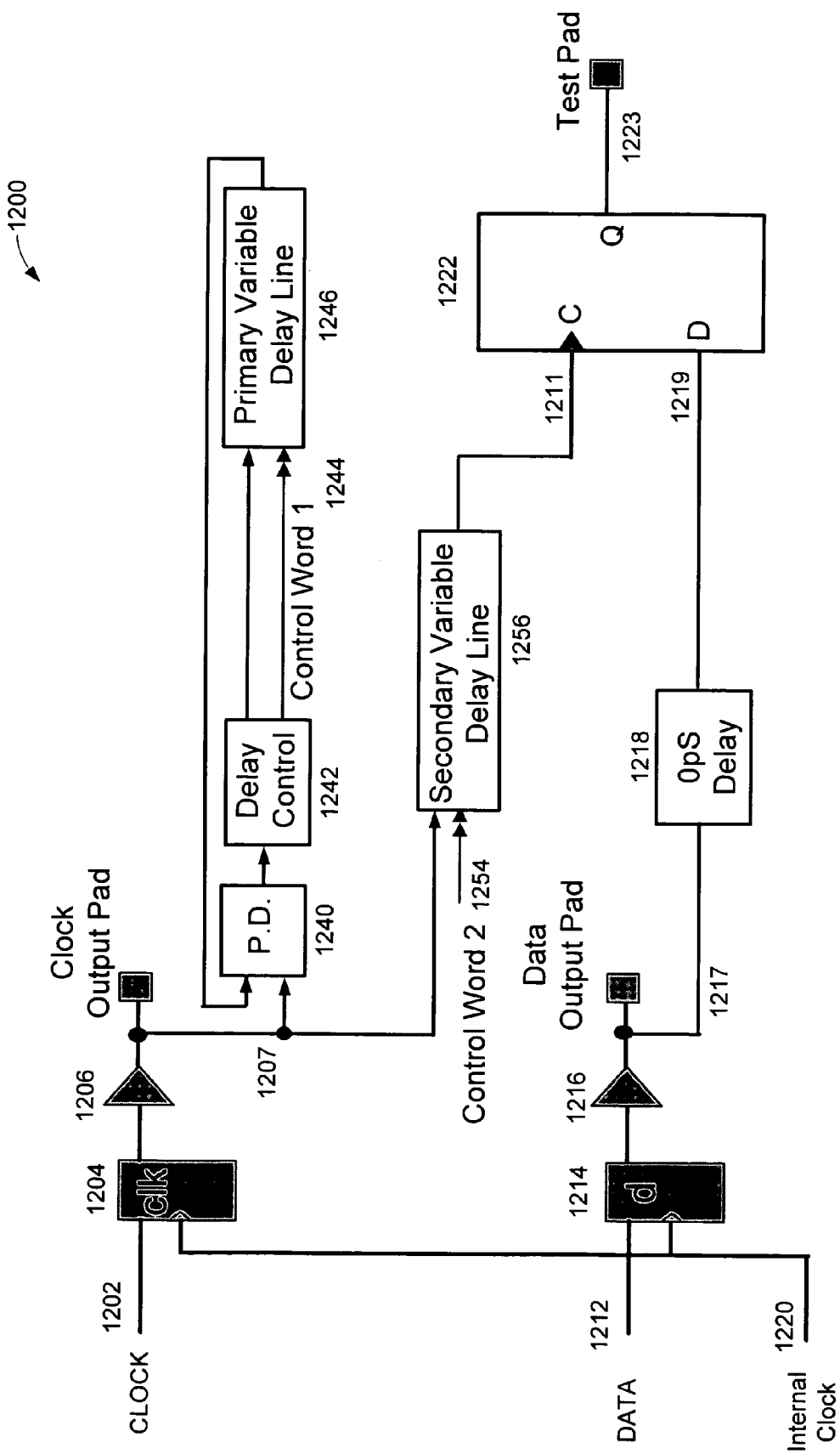

FIG. 12 illustrates one embodiment 1200 of the present invention showing accurate delay generation using a DLL and a calibrated delay chain for a single clock and a single data output and a sync source test circuit. A CLOCK 1202 and DATA 1212 are clocked by an Internal Clock 1220 into respective registers 1204, and 1214, then buffered respectively by 1206, and 1216, and presented as clock output 1207 at Clock Output Pad, and as data output 1217 at Data Output Pad. The clock output 1207 then is communicated to one input of a phase detector (P.D.) 1240. The output of the P.D. 1240 goes to a Delay Control 1242 which has two outputs that go to the Primary Variable Delay Line 1246. One of the Delay Control 1242 outputs is the delayed signal (denoted by a single arrowed line) and the second output is a Control Word 1 1244 denoted by a double stacked arrowed line. The full delay of the Primary Variable Delay Line 1246 is looped back to the second input of the P.D. 1240. The P.D. 1240 and the Control Word 1 1244 is used to set the delay of the Primary Variable Delay Line 1246.

The clock output 1207 is also communicated to a Secondary Variable Delay Line 1256. The output of the Secondary Variable Delay Line 1256 goes to the clock input (C) 1211 of circuit 1222. Data output 1217 is communicated to the input of a delay 1218 which in this embodiment is 0 ps (i.e. no delay) denoted as 0 pS Delay. The output 1219 of delay 1218 is communicated to the data input (D) of circuit 1222. The output (Q) 1123 of circuit 1122 goes to a pad denoted as Test Pad.

Now the Secondary Variable Delay Line 1256 is a replica of the Primary Variable Delay Line 1246 and uses a Control Word 2 1254 derived from the Control Word 1 1244 for the Primary Variable Delay Line 1246. The Control Word 1 1244 for the Primary Variable Delay Line 1246 is known to result in one cycle (or half cycle) of delay. So, a control word that will result in a known fraction of a full cycle delay can be derived to be used in the secondary delay line (i.e. Control Word 2 1254 for controlling Secondary Variable Delay Line 1256).

One of skill in the art will appreciate that the techniques discussed may be combined and used in a variety of approaches. For example, in one embodiment of the invention, it is possible to check one or more timings of data with respect to a clock. For example, FIG. 13 illustrates one embodiment of the invention 1300 showing a single clock and a single data output and checking for two timing relationships at the same time.

Figure 13:
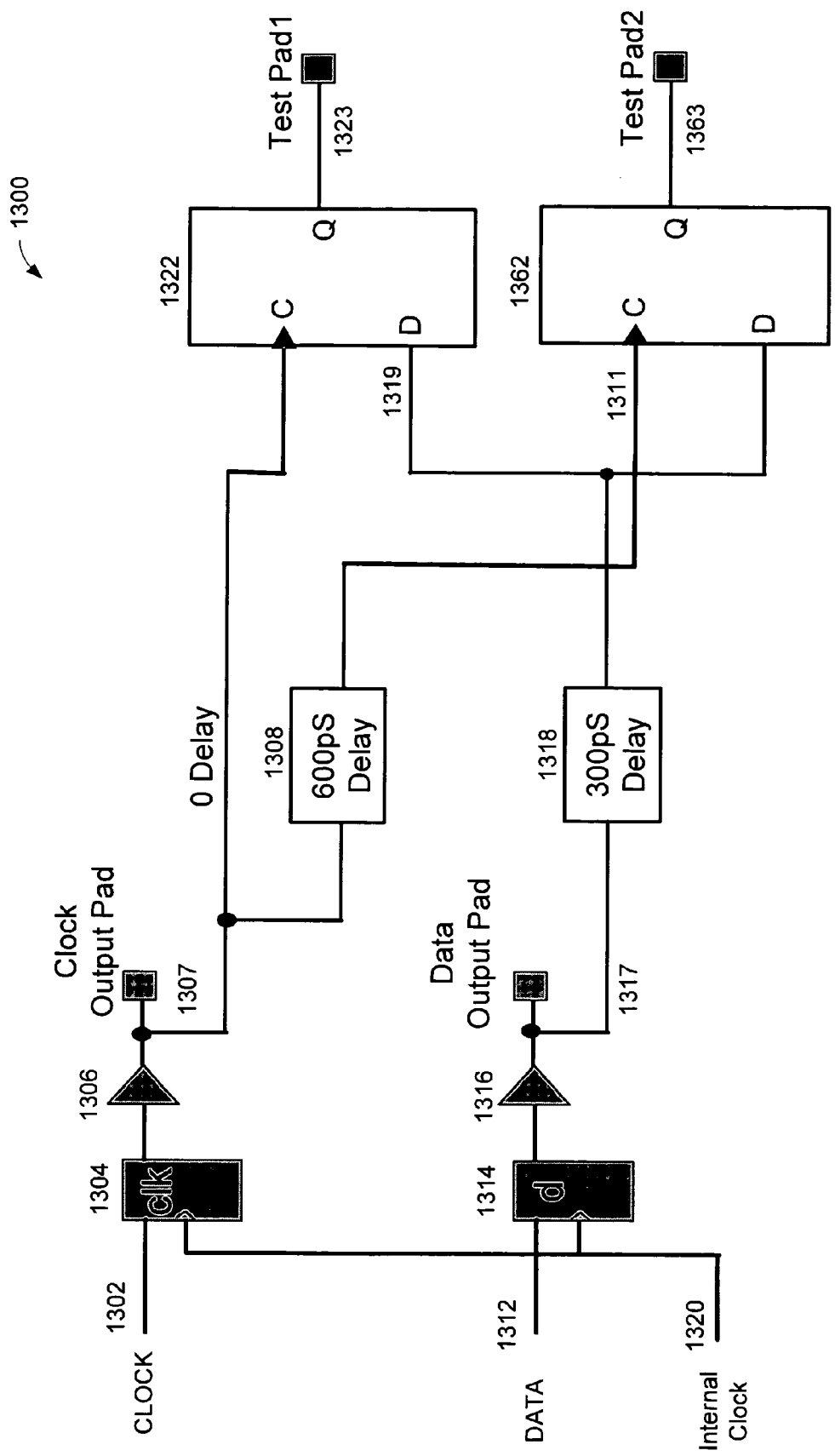
FIG. 13 illustrates one embodiment of the invention showing a single clock and a single data output and checking for two timing relationships at the same time.

FIG. 13 illustrates one embodiment of the invention 1300 showing a single clock and a single data output and checking for two timing relationships at the same time. A CLOCK 1302 and DATA 1312 are clocked by an Internal Clock 1320 into respective registers 1304, and 1314, then buffered respectively by 1306, and 1316, and presented as clock output 1307 at Clock Output Pad, and as data output 1317 at Data Output Pad. The clock output 1307 (denoted as 0 Delay) is communicated to clock input (C) of circuit 1322. Clock output 1307 is also communicated to the input of a delay 1308 denoted as 600 pS Delay. The output of delay 1308 (denoted as 1311) is communicated to the clock input (C) of circuit 1362. Data output 1317 is communicated to the input of a delay 1318 denoted as 300 pS Delay. The output of delay 1318 is communicated to the data input (D) 1319 of circuit 1322 and the data input (D) of circuit 1362. The output (Q) 1323 of circuit 1322 goes to a pad denoted as Test Pad1. The output (Q) 1363 of circuit 1362 goes to a pad denoted as Test Pad2.

With the arrangement of two comparison circuits (e.g. 1322 and 1362) each receiving a common data input (e.g. 1319) and different clock inputs (e.g. 1362 at 0 Delay, and 1322 at 600 pS Delay), one of skill in the art will appreciate that a clock "window" has been established about the data signal (e.g. 1319 into 1322 and 1362). In this manner the data signal may be checked against two clock timings at the same time. This technique may be extended to any number of timings.

Using the timings as illustrated in FIG. 13 (0 ns, 300 ps, and 600 ps) (and using positive logic levels) the following table illustrates the results expected on Test Pad1 and Test Pad2 for a none or single transitioning data signal during the clocking interval (0ps and 600 ps)

| Test Pad1 value | Test Pad2 value | Data timing | Data transition |
|---|---|---|---|
| 0 | 0 | Data low 300 ps or more before clock and low 600 ps or more after clock. | None - Data is low between the 0 ps and 600 ps delay. |
| 0 | 1 | Data low 300 ps or more before clock and going high within 300 ps after clock. | Data transitions - low to high somewhere between the 0 ps and 600 ps delay. |
| 1 | 0 | Data high 300 ps or more before clock and going low within 300 ps after clock. | Data transitions - high to low somewhere between the 0 ps and 600 ps delay. |
| 1 | 1 | Data high 300 ps or more before clock and high 300 ps or more after clock. | None - Data is high between the 0 ps and 600 ps delay. |

For example, if the delayed data rises after the 0 delay, then a 0 would be present on Test Pad 1. Likewise if the delayed data rises before the 600 ps delay, then a 1 would be present on Test Pad 1. This illustrates the situation where: Data high 300 ps or more before clock and going low within 300 ps after clock. One of skill in the art will appreciate that a go/no-go test could be easily implemented to test for a data transition, for example, within plus/minus 300 ps of the clock. For example, if an XOR circuit (not shown in FIG. 13) had inputs connected to Test Pad 1 and Test Pad2 of FIG. 13, the output of the XOR would indicate a logic one when the data signal transitioned within plus/minus 300 ps of the clock. In this way a logic zero output from the XOR would indicate that the data arrived too early or too late with respect to a timing needed of within plus/minus 300 ps of the clock. The Data transition column in the above table indicates if a transition of the data occurs between the 0 ps and 600 ps of the clock. That is, it indicates if the data makes a transition within a 600 ps window.

Figure 4:
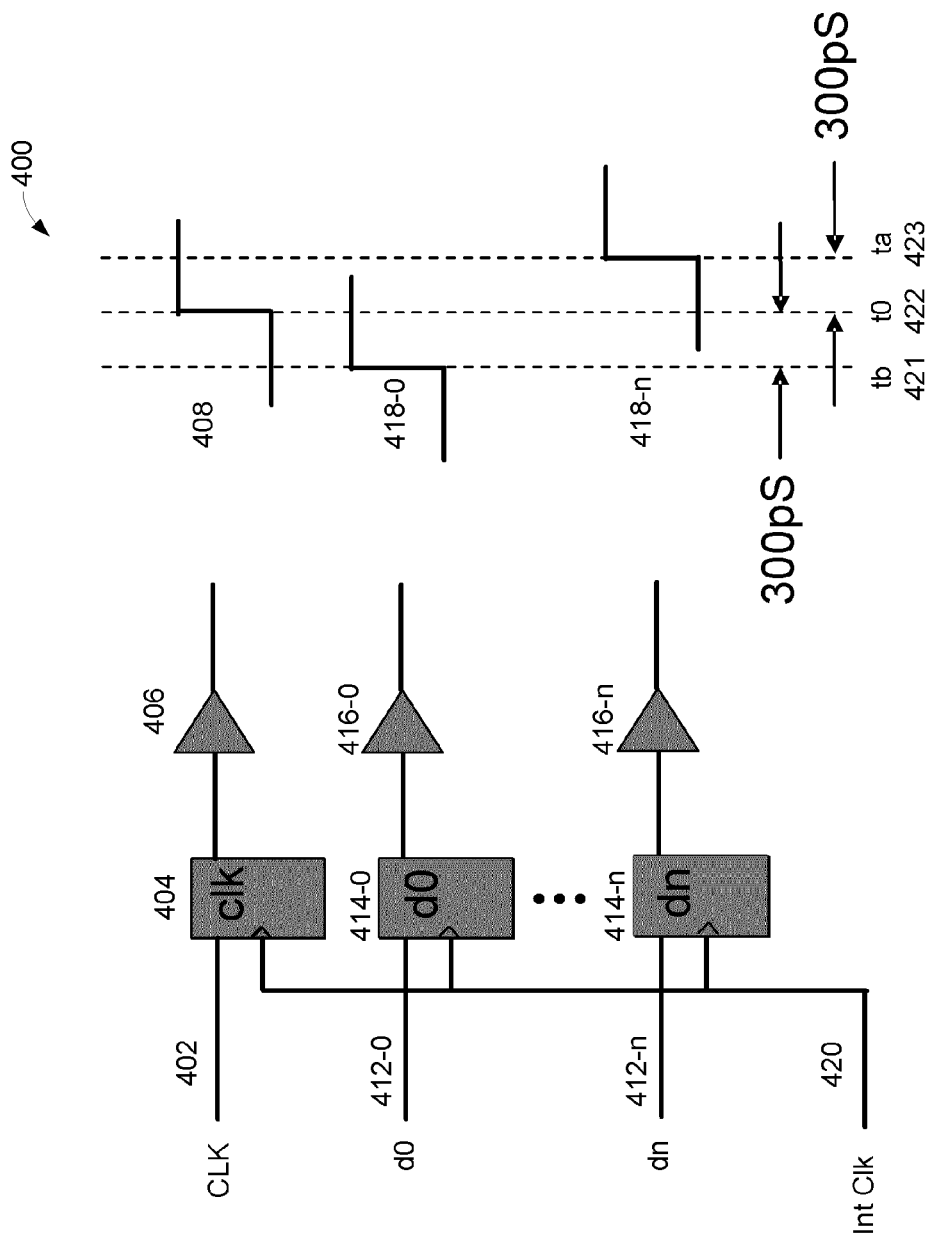
FIG. 4 illustrates a sync source datasheet specification.

While the above example used equal spaced delays (i.e. 0 ps, 300 ps, 600 ps) the invention is not so limited and asymmetrical delays may be used (e.g. 0 ps, 200 ps, 349 ps) to test for other timings and/or skews of signals to each other. Additionally, while the above description used 300 ps for an example of an existing specification (see FIG. 4 discussion), the invention is not so limited and any timing specification (e.g. 10 ps, 153 ps, 945 ps, etc.) may be used.

While the description above has generally discussed a clock and data relationship, one of skill in the art will appreciate that the invention is not so limited and that the approach may be used with a variety of signals and/or clocks. For example, the techniques discussed may be used with test patterns, for example, memory test patterns or non-memory test patterns, e.g., logic test patterns. In particular, memory test patterns may include, for example, moving inversion, march patterns, 6N march, 7N march, etc. Additionally the techniques may be used with vectors for logic circuit test. Such patterns may allow for testing the alignment of clocks and/or signals to other signals and/or clocks.

While the description above has illustrated the invention with respect to electronic circuits, the techniques of the invention are not limited to only electronic circuits. For example, optical circuits utilizing optical signals may well need the same type of alignment, testing, checking, etc. For example, in an optical application, FIG. 4 may represent optical signals (d0 to dn, 412-9 to 412-n respectively) that need to be checked for alignment with a optical clock (CLK 402). In a similar fashion to electronic components, there are equivalent optical components. For example, delays (e.g 508 and 518 in FIG. 5) have an optical equivalent of, for example, different optical path lengths, or optical components with slower propagation speeds. Switching circuits for optical signals may use for example, magneto-optical effects, electro-optical effects, acoustical-optical effects, etc. What is to be appreciated is that the techniques disclosed are not limited to electronic circuits.

Thus a method and apparatus for source synchronous testing have been described.

Figure 1:
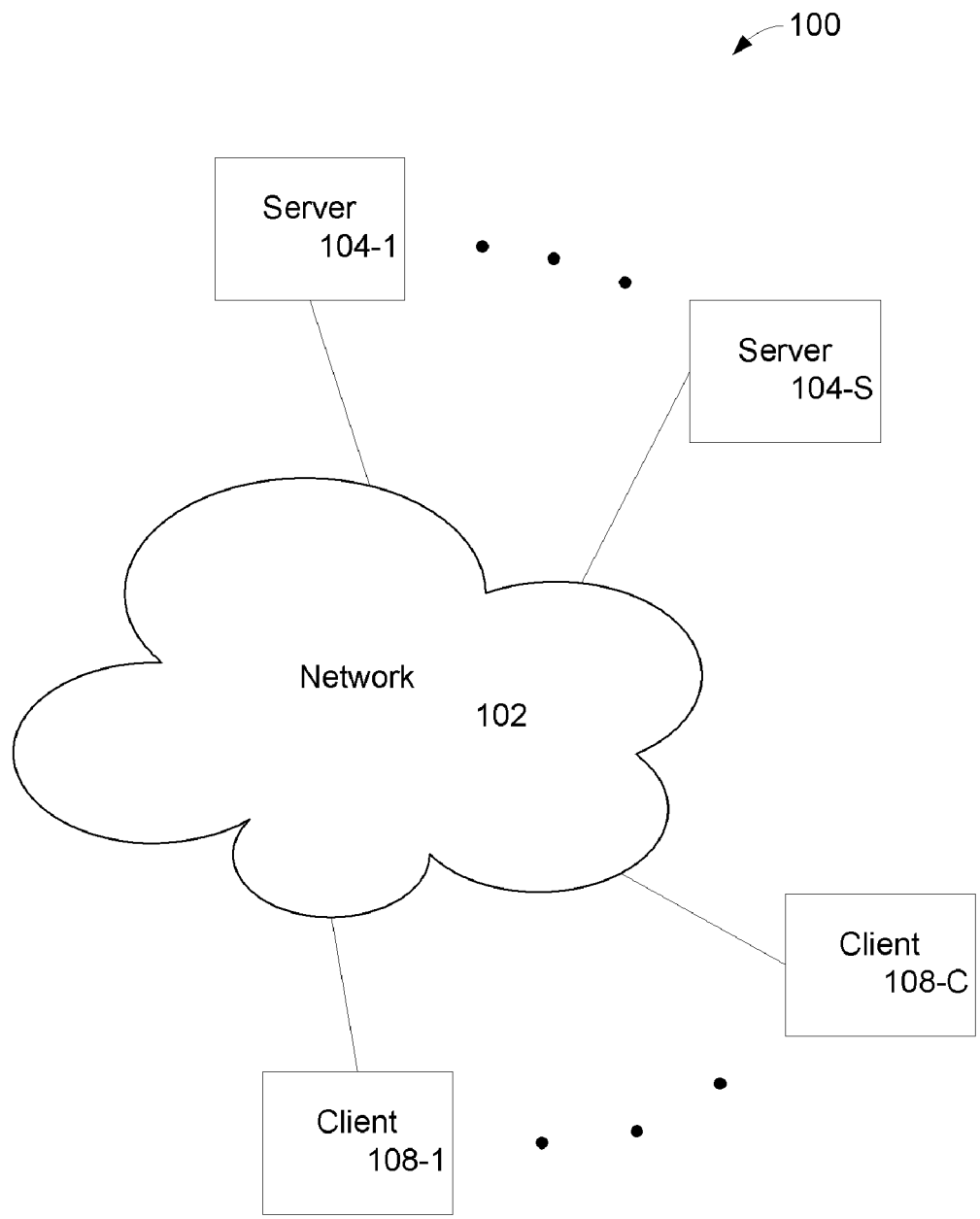
FIG. 1 illustrates a network environment in which the method and apparatus of the invention may be used.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
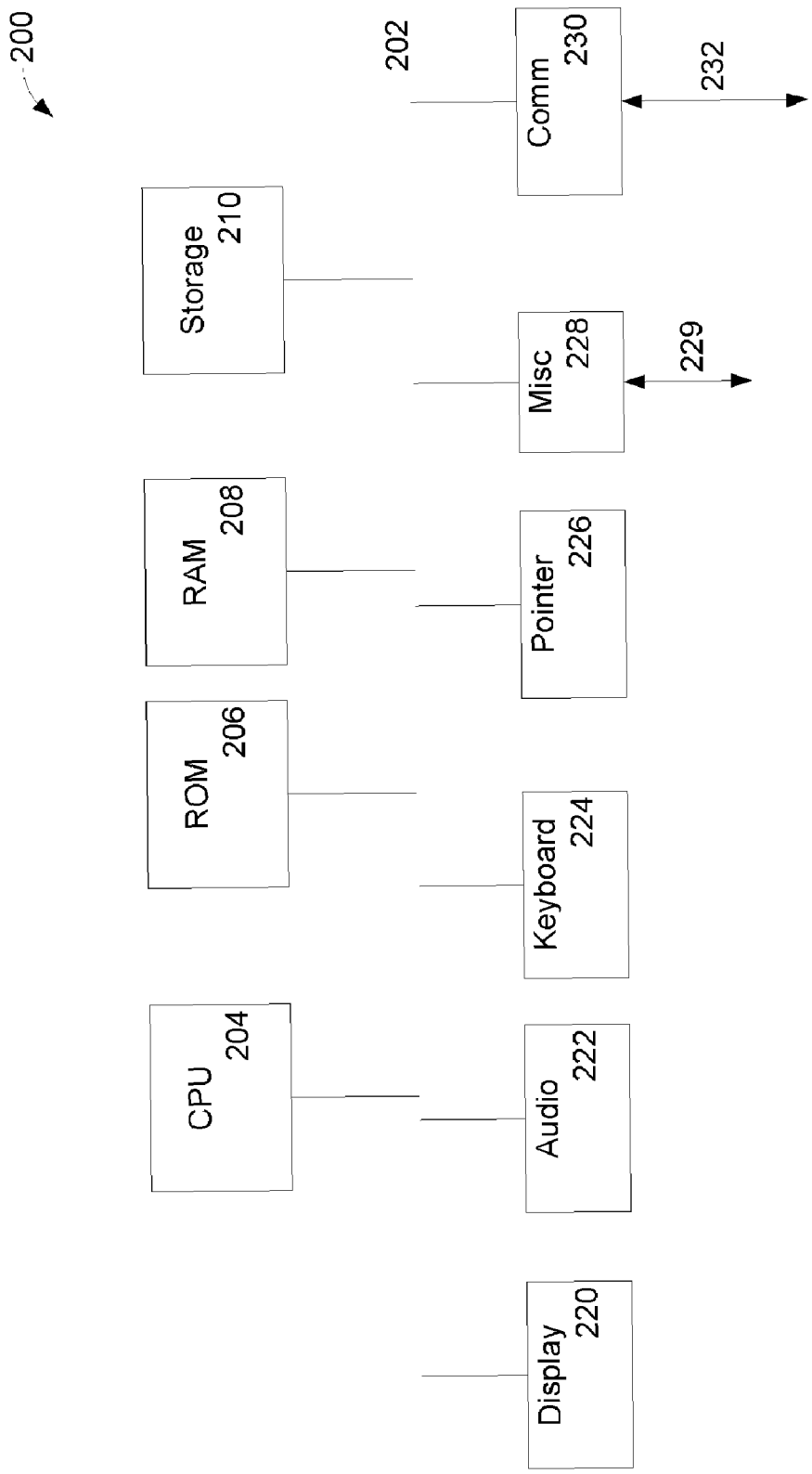
FIG. 2 is a block diagram of a computer system in which some embodiments of the invention may be used.
Figure 3:
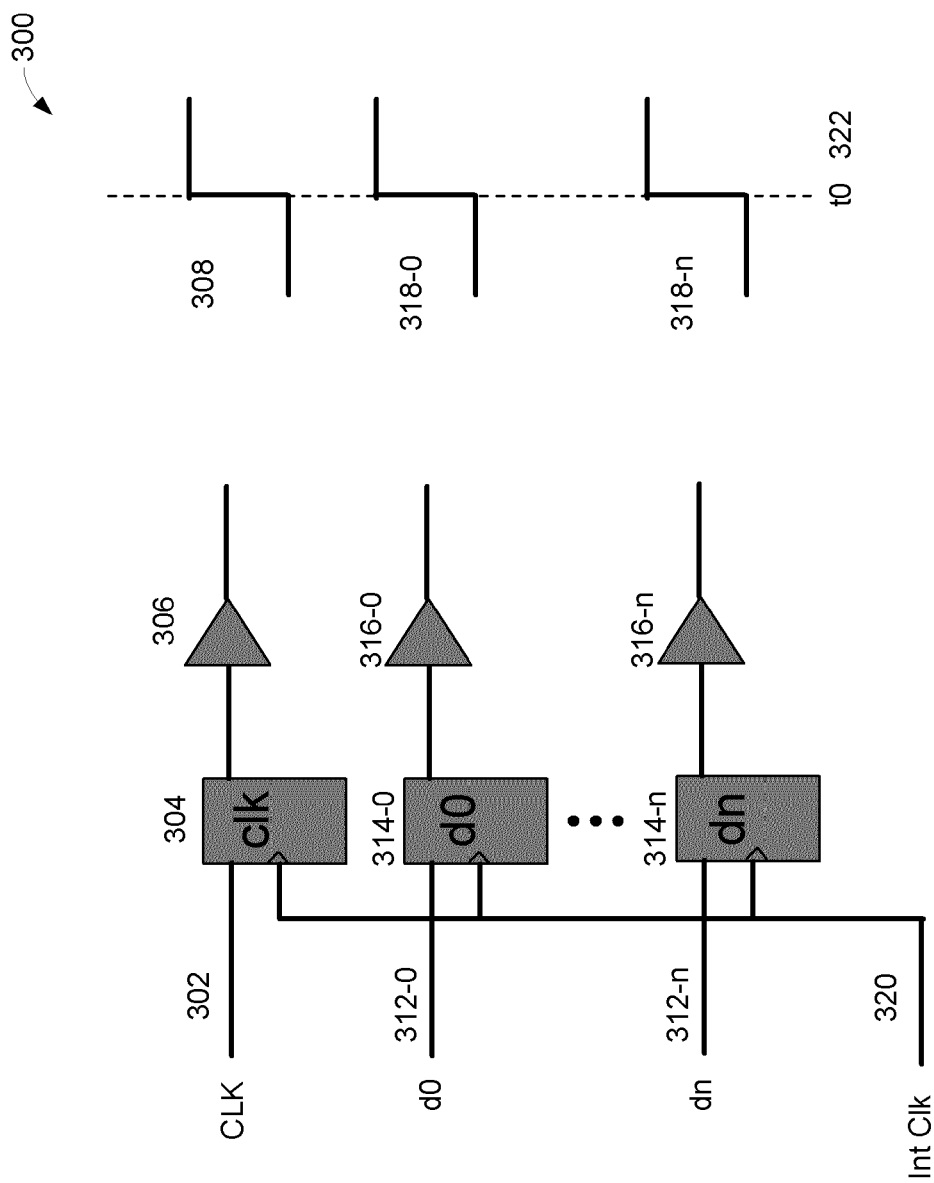
FIG. 3 illustrates ideal clocks and outputs.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Note that depending upon the actual implementation of a computer system, the computer system may include some, all, more, or a rearrangement of components in the block diagram. For example, a thin client might consist of a wireless hand held device that lacks, for example, a traditional keyboard. Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, etc. may all use embodiments of the present invention. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . .), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for source synchronous testing have been described.

What is claimed is:

1. An apparatus comprising:
   means for receiving a clock signal;
   means for selectively delaying said received clock signal;
   means for receiving a data signal;
   means for selectively delaying said received data signal;
   means for comparing said selectively delayed received clock signal and said selectively delayed received data signal;
   means for generating a comparison output; and
   means for comparing said generated comparison output and an expected output.

2. The apparatus of claim 1 further comprising:
   means for adjusting said means for selectively delaying said received clock signal to achieve said generated comparison output being the same as said expected output.

3. The apparatus of claim 1 further comprising:
   means for adjusting said means for selectively delaying said received data signal to achieve said generated comparison output being the same as said expected output.

4. The apparatus of claim 3 wherein said means for selectively delaying is selected from the group consisting of one or more fixed delays, one or more delay locked loops, one or more phase detectors, one or more variable delay lines, and one or more phase interpolators.

* * * * *